United States Patent [19]
Tumolillo

[11] 3,947,841
[45] Mar. 30, 1976

[54] CHANNEL ELECTRON MULTIPLIER SIGNAL DETECTOR AND DIGITIZER

[75] Inventor: Thomas A. Tumolillo, Woodbridge, Va.

[73] Assignee: The United States of America as represented by the Secretary of the Army, Washington, D.C.

[22] Filed: Aug. 28, 1973

[21] Appl. No.: 392,375

[52] U.S. Cl.............. 340/324 M; 250/207; 313/95; 313/103 CM; 340/343; 340/324 A
[51] Int. Cl.² ........................................ G08B 23/00
[58] Field of Search. 235/61.6 A, 61.11 G, 61.11 E; 250/227, 219 D, 219 Q, 217 CR, 213 VT, 207; 178/DIG. 22; 340/347 P, 347 AD, 324 A, 324 M, 343; 313/103, 95

[56] References Cited
UNITED STATES PATENTS

| | | | |
|---|---|---|---|
| 3,184,732 | 5/1965 | Haynes .................... | 235/61.6 A X |
| 3,308,438 | 3/1967 | Spergel et al. .................... | 250/227 |
| 3,310,681 | 3/1967 | Hargens .................... | 250/227 X |
| 3,400,291 | 9/1968 | Sheldon .................... | 250/227 |
| 3,453,050 | 7/1969 | Arrowood et al. .......... | 235/61.11 G |
| 3,538,312 | 11/1970 | Genahr .................... | 250/227 |
| 3,539,995 | 11/1970 | Brandt .................... | 340/324 M |
| 3,644,714 | 2/1972 | Phillips et al. .............. | 340/347 AD |
| 3,652,855 | 3/1972 | McIntyre et al. .............. | 250/227 X |
| 3,669,550 | 6/1972 | Grant et al. .................... | 250/207 X |
| 3,676,676 | 7/1972 | Somer .................... | 250/207 X |
| 3,699,375 | 10/1972 | Weibel .................... | 313/95 |
| 3,723,977 | 3/1973 | Schaufele .................... | 340/324 M |

*Primary Examiner*—Thomas J. Sloyan
*Attorney, Agent, or Firm*—Nathan Edelberg; Robert P. Gibson; Saul Elbaum

[57] ABSTRACT

A device for digitalizing oscilloscope traces of fast transient signals is provided in which a plurality of channel electron multipliers are arranged with their cathodes in a coordinate array in the path of a cathode ray beam such that the trace of the beam thereacross energizes those channel electron multipliers in the path of the oscilloscope trace. These multipliers remain energized until their anodes and associated anode circuits are scanned by a digital indexing device in a predetermined raster, synchronized with the oscilloscope, by which the respective coordinates of the energized multipliers are determined and stored in a memory so that the trace can be reproduced at any given time for subsequent analysis.

8 Claims, 7 Drawing Figures

U.S. Patent   March 30, 1976   3,947,841
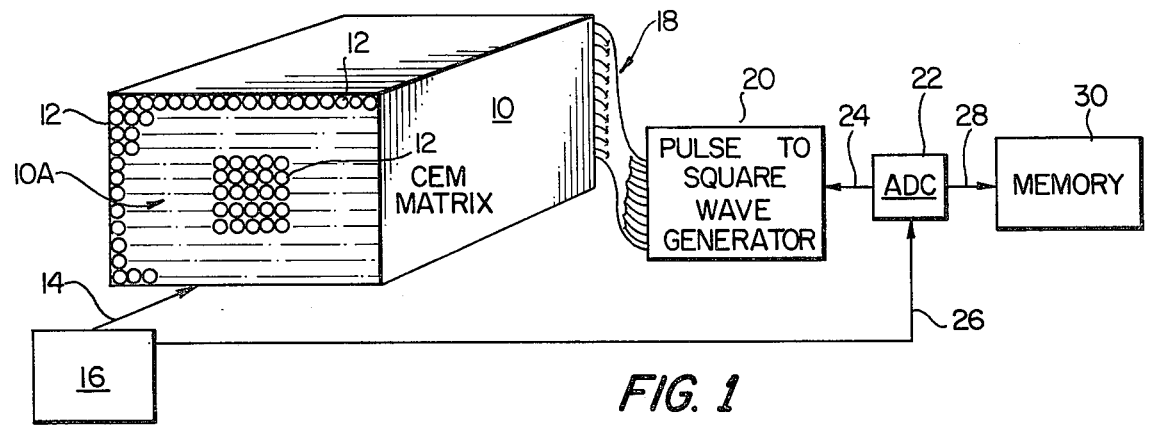
FIG. 1
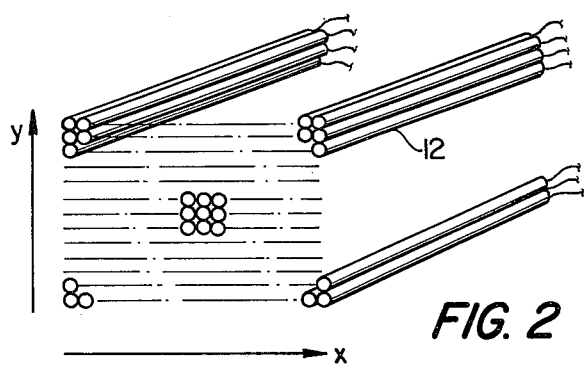
FIG. 2
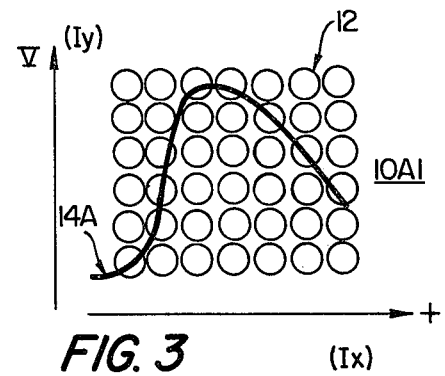
FIG. 3
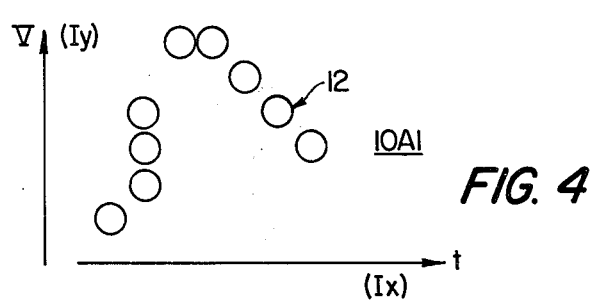
FIG. 4
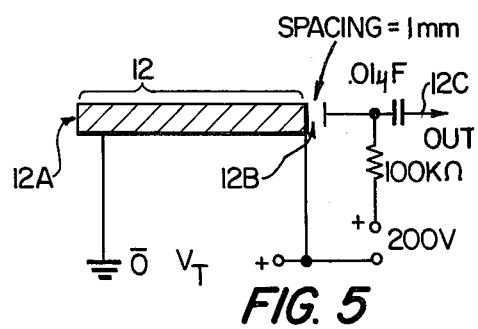
FIG. 5
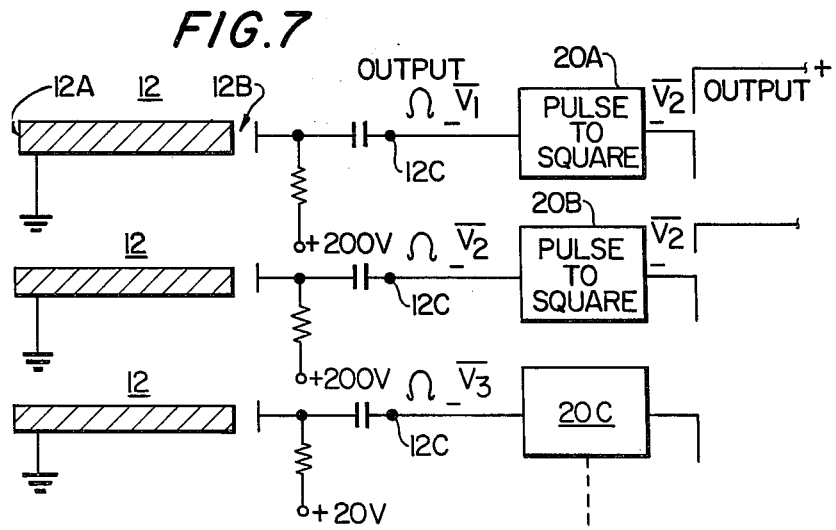
FIG. 7
FIG. 6

CHANNEL ELECTRON MULTIPLIER SIGNAL DETECTOR AND DIGITIZER

RIGHTS OF THE GOVERNMENT

The invention described herein may be manufactured, used, and licensed by or for the United States Government for governmental purposes without the payment to me of any royalty thereon.

BACKGROUND OF INVENTION

1. Field of Invention

This invention relates to digitalization of fast transient electric signals and more particularly to the direct digitalization of a single sweep oscilloscope trace of such signals.

2. Description of Prior Art

In the prior art, fast transient waveforms, in order to be digitized for analysis, first were photographed to scale and then digitized and placed in appropriate storage devices for subsequent analysis.

SUMMARY OF THE INVENTION

It is an object of the present invention to provide new and novel means to automatically digitize transient signal waveforms of random duration and store the digitized signal directly in a memory device without intermediate photography and without the use of digitizing means which require human intervention.

It is another object of the present invention to provide new and novel means to automatically digitize transient signal waveforms of random duration and store the digitized signal directly in a memory device wherein said means includes an array of electron multiplier devices scanned by an electron beam modulated by said transient signal waveform.

Still another object of the present invention is to provide means for automatically digitizing a single sweep oscilloscope trace of a transient signal.

Yet another object of the present invention is to provide means for automatically digitizing a single sweep oscilloscope trace of a transient signal and directly storing the digitized result in a memory device.

These and other objects of the present invention are achieved in a preferred embodiment of the invention by replacing the phosphor screen of a cathode ray tube of an oscilloscope device with an array of electron mulitplier devices such as channeltrons or Spiraltron Electron Multipliers, the latter being known in the trade, for example, as an SEM4219 of Bendix Corporation, said array being defined by a Cartesian coordinate system defining the respective positions in the array of the input and output ends of the electron multiplier devices which are in the basic shape of elongated cylinders arranged in stacked parallel juxtaposition such that they resemble a group of fiber optics. An oscilloscope sweep of a cathode ray beam across the input ends of the array causes certain ones of the electron multipliers to be energized in a pattern definitive of the waveform shape of the transient signal traced by said oscilloscope beam.

The output of each electron multiplier in the array is monitored and a square wave output generated by a suitable generating means in response to the energization thereof, with the duration of the square wave being sustained until monitored by an analog-to-digital converter which strokes the display according to a predetermined coordinate raster. The X and Y coordinates (row and column) locations of the output ends of the energized electron multipliers are thus determined by sensing the square wave outputs in any suitable manner well known in the art and the said coordinates then stored in memory locations correlated to the coordinate raster for subsequent retrieval and analysis. Upon sensing by the a digital indexing device (ADC hereinafter), the square wave generator associated with each energized electron multiplier is reset, also by any suitable means well known in the art. Once the transient waveform has been digitized and placed in the memory device, the latter can be programmed to drive any suitable visual display for reproducing the waveform and/or any suitable computing device for analytical purposes.

The device of the present invention can also be utilized to digitize and store any type of image developed in the array for subsequent reproductions and analysis.

BRIEF DESCRIPTION OF THE DRAWINGS

A more complete understanding and appreciation of the invention and the many attendant advantages thereof will be had by reference to the following detailed description when considered in connection with the accompanying drawings which are as follows:

FIG. 1 is a block diagram of the present invention;

FIG. 2 is a schematic illustration of a matrix of electron multiplier devices in a predetermined row and column coordinate disposition;

FIG. 3 is a schematic illustration of a waveform trace superimposed on a pattern of the input ends of a matrix of electron multipliers;

FIG. 4 is a schematic of the discrete energized electron multiplier devices in the matrix of FIG. 3 resulting from the waveform trace shown therein;

FIG. 5 is a schematic of the circuitry of biasing and operating a single electron multiplier device;

FIG. 6 is a schematic illustration of the connections between the digital indexing device, the square wave generating means and the oscilloscope of the present invention; and FIG. 7 is a schematic illustration of several detection channels including a graphic portrayal of the parameters utilized to effect a coded digitalized storage of a given waveform.

DESCRIPTION OF THE PREFERRED EMBODIMENT

Referring in detail to the drawings and with initial reference to FIG. 1, the present invention is shown as embodying a square matrix 10 of closely spaced or juxtaposed channel electron multipliers 12 having the cathode ends thereof disposed in a common plane 10A of the matrix 10 for impingement by the electron beam 14 of an oscilloscope 16 having the said common plane 10A of cathode ends of the channel electron multipliers 12 in the position normally occupied by the phosphor screen of the cathode ray tube of the oscilloscope 16.

The anode ends of the channel electron multipliers 12 (hereinafter referred to as CEMs 12), are connected by respective output leads 18 to the inputs of a square wave generating network 20 including a pulse responsive square wave generating circuit for each of the CEMs 12.

A digital indexing device 22 (hereinafter referred to as ADC 22) is coupled with the square wave generating network 20 by a connection 24 to sequentially sample the status of each individual square wave generator means in the network 20 by suitable strobe and detecting means well known in the art under the control of a conventional synchronizing or trigger circuit interconnection 26 from the oscilloscope 16. This synchronizes and coordinates the strobe and sample rate of the ADC 22 with the scan rate of the electron beam 14 in the oscilloscope 16.

The ADC 22 provides an output indication of the status of each CEM 12 through a data output 28, the latter feeding a suitable memory device 30 such as a random access computer memory (RAM) or a magnetic tape storage device in an address sequence correlated to predetermine coordinates of the common plane 10A of the matrix 10.

Referring next to FIG. 2, a rectangular array 10A of CEMs 12 is shown in a row and column configuration with a Cartesian coordinate $(x, y)$ system having $N_y$ CEMs 12 per column and $N_x$ CEMs 12 per row, each CEM 12 comprising an individual electron multiplier channel.

Now, the y location of a given CEM 12 can be defined by an integer, $I_y$, where $1 \leq I_y \leq N_y$ and the $x$ location of a given CEM 12 can be defined by an integer, $I_x$, where $1 \leq I_x \leq N_x$.

Accordingly, with the foregoing coordinates and the integers $I_x$ and $I_y$ as the defining parameters for the location of any given CEM 12 in the rectangular array 10A, the $x$-parameter $I_x$ defines an address in the memory 30 of FIG. 1 designating a given column of the array 10A and the y-parameter $I_y$ defines the information to be stored in that address to designate a given row in the array 10A.

Thus, both the $I_x$ and $I_y$ parameters can be generated by counters in a manner well known in the art.

Referring to FIG. 3 there is shown as small 8 × 8 matrix 10A1 of CEMs 12 on which an electron beam trace 14A has been superimposed, representing an oscilloscope trace of a monitored signal. The $x$ coordinate is proportional to the real time $t$ of the trace and the $y$ coordinate is proportional to the deflection voltage V of the electron beam 14, as shown.

The graphic representation of FIG. 4 illustrates those CEM's 12 in the array 10A1 of FIG. 3 which have been energized by the trace 14A of FIG. 3. It is this pattern in the array 10A1 that lends itself to analysis for digitizing the trace 14A.

Each CEM 12 will produce an output voltage in response to even one electron impinged thereon by the electron beam 14. A typical biasing schematic for each CEM 12 is shown in FIG. 5 in which the cathode end 12A of a CEM 12 is connected to ground and the anode end 12B is coupled to a positive bias of 200 volts and capacitance coupled to an output terminal 12C at which output voltage pulses appear in response to the impingement of the electron beam 14 on the cathode end 12A of the CEM 12.

Referring now to FIG. 7, three CEMs are shown with the output 12C of each connected to respective pulse-to-square wave converter circuits 20A, 20B and 20C.

Each of these converter circuits 20 (A,B,C) produce a square wave output signal voltage which remains on for a duration determined by the sampling or strobe rate of the ADC22, the latter acting to reset each converter circuit 20 to zero immediately after sampling the output thereof by any suitable manner well known in the art. The interconnection of converter circuits 20, digital indexing device 22, and line 26 coupled to oscilloscope 16 is illustrated in FIG. 6.

Thus, one pulse-to-square wave converter circuit 20 (A,B,C...) is connected with the anode 12C of each of the CEMs 12 in the array 14A1 and the output of each converter 20(A,B,C...) is scanned and sampled by the ADC22 in synchronism with the rate of scan of the oscilloscope 16 (and electron beam 14) as constrained by the timing connection 26 previously described with reference to FIG. 1.

The presence or absence of a square wave output from the respective converter circuits 20 (A,B,C...) can be designated by a digital "one" or "zero" by the ADC 22 and the memory 30 thus receives a digitized indication of which of the CEMs 12 in the matrix 10A1 have been energized by the trace 14A. In other words, the trace pattern of FIG. 4 is thus stored in the memory 30.

For example, if the memory 30 includes a storage matrix coinciding with the array 14A1, then each column address ($I_x$) will contain a series of 1s or 0s corresponding to the corresponding number of row addresses ($I_y$) associated with each column ($I_y$) with the stored 1s defining the pattern of FIG. 4.

The contents of the memory 30 can subsequently be read out in a predetermined sequence to drive a CRT display or other visual readout devices to reconstruct the trace 14A at a desired future time. Also, by a similar process, the same data can be used for mathematical analysis of the now recorded trace 14A1.

Of course, the size of any given array of CEMs 12 can be greatly expanded from that of the example of FIGS. 3 and 4. One suitable carry array size is $N_x = N_y = 1024$ which would include 1,048,876 CEMs 12. Resolutions of 25 or more CEMs 12 to the inch are contemplated. In this example, the ADC 22 would have to sample all 1,048,876 CEMs 12 with the various scanning techniques known in the art for large arrays being contemplated to reduce the number of circuit components required.

I wish it to be understood that I do not desire to be limited to the exact details of construction shown and described, for obvious modifications can be made by a person skilled in the art.

I claim:

1. Means for digitizing oscilloscope traces of transient waveforms and the like defined by the path of travel of an electron beam, comprising:

oscilloscope means having a predetermined scan rate generating said electron beam, said oscilloscope having a main envelope;

a plurality of channel electron multipliers within said main envelope having anodes and cathodes with said cathodes arranged in a substantially planar array defined by coordinate parameters in the path of said electron beam;

a stable output responsive means at each of said anodes generating an output signal in response to the impingement of said electron beam on a corresponding cathode;

converter means for strobing said output responsive means to sample said output signals in a predetermined sequence correlated to said coordinate parameters and generating digital signals indicating the presence or absence of a said output signal; and memory means driven by said converter means for storing said digital signals in said predetermined sequence to thereby store a digital representation of the path of travel of said electron beam across said cathodes as a function of said coordinate parameters.

2. The invention defined in claim 1, wherein said channel electron multipliers produce an output pulse at the respective anodes thereof in response to impingement of said electron beam on corresponding ones of said cathodes; and wherein each of said output responsive means comprises pulse responsive means generating said output signal for an indeterminate duration in response to a said output pulse at a corresponding one of said anodes.

3. The invention defined in claim 2, wherein there is further provided means for constraining each of said output responsive means to terminate its output signal when said converter means samples said output signal.

4. The invention defined in claim 1, including circuit means interconnecting said converter means and said oscilloscope means to synchronize the strobe rate of said converter means with said scan rate of said oscilloscope means.

5. The invention defined in claim 1, wherein said channel electron multipliers produce an output pulse at the respective anodes thereof in response to impingement of said electron beam on corresponding ones of said cathodes;

wherein each of said output responsive means comprises pulse responsive means generating said output signal for an indeterminate duration in response to a said output pulse at a corresponding one of said anodes; and including circuit means interconnecting said converter means and said oscilloscope means to synchronize the strobe rate of said converter means with said scan rate of said oscilloscope means.

6. The invention defined in claim 5, wherein there is further provided means for constraining each of said output responsive means to terminate its ouput signal when said converter means samples said output signal.

7. The invention defined in claim 1, wherein said coordinate parameters comprise an X, Y Cartesian coordinate system defining said substantially planar array of cathodes in rows and columns designated, respectively, by said X and Y coordinates.

8. The invention defined in claim 7, wherein said coordinates define addresses in said memory means correlated with said predetermined strobe sequence of said converter means.

* * * * *